United States Patent
Alers et al.

(10) Patent No.: US 6,265,260 B1
(45) Date of Patent: *Jul. 24, 2001

(54) METHOD FOR MAKING AN INTEGRATED CIRCUIT CAPACITOR INCLUDING TANTALUM PENTOXIDE

(75) Inventors: Glenn B. Alers, Chatham, NJ (US); Pradip Kumar Roy, Orlando, FL (US)

(73) Assignee: Lucent Technologies Inc., Murray Hill, NJ (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/345,556

(22) Filed: Jun. 30, 1999

Related U.S. Application Data

(60) Provisional application No. 60/115,530, filed on Jan. 12, 1999.

(51) Int. Cl.[7] .................................................. H01L 21/8242
(52) U.S. Cl. ......................... 438/240; 438/238; 438/243; 438/398; 438/396; 438/253; 438/386; 257/310
(58) Field of Search .................................... 438/240, 238, 438/243, 398, 396, 253, 386; 257/310

(56) References Cited

U.S. PATENT DOCUMENTS

| | | | |
|---|---|---|---|
| 5,576,240 | 11/1996 | Radosevich et al. | 437/60 |
| 5,622,888 | * 4/1997 | Sekine et al. | 438/398 |
| 5,780,115 | * 7/1998 | Park et al. | 427/539 |
| 5,825,073 | 10/1998 | Radosevich et al. | 257/534 |
| 5,851,870 | 12/1998 | Alugbin et al. | 438/239 |
| 5,903,493 | 5/1999 | Lee | 365/149 |
| 5,910,218 | * 6/1999 | Park et al. | 118/719 |
| 5,910,880 | * 6/1999 | DeBoer et al. | 361/311 |
| 5,912,797 | 6/1999 | Schneemeyer et al. | 361/311 |
| 5,913,118 | 6/1999 | Wu | 438/243 |

OTHER PUBLICATIONS

Hiroshi Shianrki et al., UV–O3 and Dry–O2: Two–Step Annealed Chemical Vapor–Deposited Ta2O5 Flims fro Storage Dielectrics of 64–Mb DRAM's IEEE Trans. Electron Devices vol. 38 No. 3, Mar. 1991.*

Alers et al., *Nitrogen Plasma Annealing for Low Temperature TA205 Films*, Applied Physics Letters, US, American Institute of Physics. New York, vol. 72, No. 11, Mar. 16, 1998, pp. 1308–1310 XP000742858, ISSN: 0003–6951.

Yamagishi et al., *Stacked Capacitor Dram Process Using Photo–CVD TA205 Film*, IEEE Transactions on Electron Devices, US, IEEE Inc., New York, vol. 35, No. 12, Dec. 1, 1998, p. 2439, XP0000496986, ISSN: 0018–9383.

(List continued on next page.)

*Primary Examiner*—Matthew Smith
*Assistant Examiner*—Belur Keshavan
(74) *Attorney, Agent, or Firm*—Allen, Dyer, Doppelt, Milbrath & Gilchrist, P.A.

(57) ABSTRACT

A method for making an integrated circuit capacitor which in one embodiment preferably comprises the steps of: forming, adjacent a semiconductor substrate, a first metal electrode comprising a metal nitride surface portion; forming a tantalum pentoxide layer on the metal nitride surface portion while maintaining a temperature below an oxidizing temperature of the metal; remote plasma annealing the tantalum pentoxide layer; and forming a second electrode adjacent the tantalum pentoxide layer. The step of forming the tantalum pentoxide layer preferably comprises chemical vapor deposition of the tantalum pentoxide at a temperature below about 500° C. Accordingly, oxidation of the metal is avoided and a high quality tantalum pentoxide is produced. The metal of the first metal electrode may comprise at least one of titanium, tungsten, tantalum, and alloys thereof.

27 Claims, 2 Drawing Sheets

OTHER PUBLICATIONS

Tanimoto et al., *Investigation on Leakage Current Reduction of Photo–CVD Tantalum Oxide Films Accomplished by Active Oxygen Annealing*, Journal of the Electrochemical Society, US, Electrochemical Society, Manchester, New Hampshire, vol. 139, No. 1, 1992, pp. 320–328, XP000261719, ISSN: 0013–4651.

Chaneliere et al., *Tantalum pentoxide (Ta2O5) thin films for advanced dielectric applications*, Materials Science and Engineering R: Reports, CH, Elsevier Sequoia S.A., Lausanne, vol. 22, No. 6, May 25, 1998, pp. 269–322, XP004130212, ISSN:0927–796X.

Devine et al., *Electrical Properties of TA2O5 Films Obtained by Plasma Enhanced Chemical Vapor Deposition Using a TAF5 Source*, Applied Physics Letters, US, American Institute of Physics. New York, vol. 68, No. 13, Mar. 25, 1996, pp. 1775–1777, XP000582376, ISSN: 0003–6951.

Matusi et al., *Reduction of Current Leakage in Chemical–Vapor Deposited TA2O5 Thin–Films by Oxygen–Radical Annealing*, IEEE Electron Device Letters, US, IEEE Inc., New York, vol. 17, no. 9., Sep. 1, 1996, pp. 431–433, XP000625748, ISSN: 0741–3106.

Zhang et al., Characteristics of High Quality Tantalum Oxide Films Deposited by Photoinduced Chemical Vapor Deposition, Applied Physics Letters, US, American Institute of Physics, New York, vol. 73, No. 16, Oct. 19, 1998, pp. 2299–2301, XP000788526, ISSN: 0003–6951.

Sun–Oo et al., *The Effect of Substrate Temperature on the Composition and Growth of Tantalum Oxide Thin Films Deposited by Plasma–Enhanced Chemical Vapour Deposition*, Thin Solid Films, CH, Elsevier–Sequoia S.A. Lausanne, vol. 206, No. 1/02, Dec. 10, 1991, pp. 102–106, XP000355319, ISSN: 0040–6090.

* cited by examiner

METHOD FOR MAKING AN INTEGRATED CIRCUIT CAPACITOR INCLUDING TANTALUM PENTOXIDE

RELATED APPLICATION

This application is based upon prior filed copending provisional application Ser. No. 60/115,530 filed Jan. 12, 1999.

FIELD OF THE INVENTION

The present invention relates to the field of semiconductors, and, more particularly, to a method for making a capacitor in an integrated circuit.

BACKGROUND OF THE INVENTION

An integrated circuit typically includes transistors and other devices formed on a semiconductor substrate. A capacitor may be provided as part of an integrated circuit by forming a first conductive electrode, a dielectric layer on the first electrode, and a second conductive electrode on the dielectric layer. Such capacitors are commonly used in memory cells for DRAM devices, for example, as well as in analog-to-digital converters and other circuits.

As disclosed in U.S. Pat. No. 5,910,880 to DeBoer et al., for example, tantalum pentoxide ($Ta_2O_5$) is a desired material for a capacitor dielectric because of its relatively high dielectric constant of about 25. In comparison, silicon nitride has a dielectric constant of about 8, and silicon dioxide has a dielectric constant of about 4. The high dielectric constant of tantalum pentoxide allows a thinner layer of the material to be used between the electrodes to achieve the same capacitance as using other lower dielectric constant materials.

A typical construction of such a capacitor includes a first or lower electrode of polycrystalline silicon. A first barrier layer of silicon nitride is typically provided to protect the polycrystalline silicon from forming into silicon dioxide and to prevent diffusion as the tantalum pentoxide is deposited thereon. A second barrier layer of titanium nitride or tungsten nitride may be deposited over the tantalum pentoxide prior to forming the polycrystalline silicon or metal layer of the upper electrode.

U.S. Pat. No. 5,622,888 to Sekine et al. discloses making a DRAM capacitor also using tantalum pentoxide. A layer of tungsten is sputter deposited on a polysilicon lower electrode. The tantalum pentoxide is deposited by chemical vapor deposition (CVD) at a temperature in a range of 300 to 600° C. Unfortunately, the higher temperatures may have a tendency to oxidize the tungsten. Thereafter, the tantalum pentoxide is densified by a plasma using an oxygen gas at a temperature ranging from 200 to 600° C. An upper tungsten electrode is formed on the tantalum pentoxide.

Despite continuing development in the field of integrated circuit capacitors using tantalum pentoxide as the dielectric, there still exists a need to further develop the manufacturing process to produce such capacitors having relatively high capacitance values and other desirable properties.

SUMMARY OF THE INVENTION

In view of the foregoing background, it is therefore an object of the invention to provide a method for making an integrated circuit capacitor having a relatively high capacitance.

This and other objects, features and advantages in accordance with the present invention are provided by a method for making an integrated circuit capacitor which in one embodiment preferably comprises the steps of: forming a first metal electrode adjacent a semiconductor substrate; forming a tantalum pentoxide layer on the first metal electrode while maintaining a temperature below an oxidizing temperature thereof; performing at least one remote plasma anneal of the tantalum pentoxide layer while also maintaining a temperature below the oxidizing temperature of the first metal electrode; and forming a second electrode adjacent the tantalum pentoxide layer while also maintaining a temperature below the oxidizing temperature of the first metal electrode. The step of forming the tantalum pentoxide layer preferably comprises chemical vapor deposition of the tantalum pentoxide at a temperature below about 500° C., and, more preferably, below about 400° C. The CVD forming of the tantalum pentoxide may preferably be performed in less than about 10 minutes. In addition, the pressure during CVD is typically greater than about 3 Torr, such as in a range of 3 to 15 Torr.

To reduce damage to the tantalum pentoxide layer, the step of annealing preferably comprises exposing the tantalum pentoxide layer to a first remote plasma of pure nitrogen and to a second remote plasma including nitrogen and oxygen. Accordingly, oxidation of the metal of the first electrode is avoided and a high quality tantalum pentoxide is produced by the method of the invention.

The metal of the first metal electrode may comprise at least one of titanium, tungsten, tantalum, platinum, iridium, ruthenium, and alloys thereof. More preferably, the first metal electrode comprises at least one of titanium, tungsten, tantalum, and alloys thereof. Most preferably the metal comprises titanium nitride.

The method may further include the steps of: forming at least one dielectric layer adjacent the semiconductor substrate, and forming an opening in the at least one dielectric layer. Accordingly, the step of forming the first metal electrode layer may comprise forming the first metal electrode layer to line the opening in the at least one dielectric layer.

The step of forming the first metal electrode may comprise the steps of forming a first metal layer and nitridizing an upper surface portion thereof according to one embodiment. The step of nitridizing may preferably include exposing the first metal layer to a nitrogen containing ambient while maintaining a temperature below the oxidizing temperature of the metal. Alternately, the step of forming the first metal electrode may comprise depositing a first metal layer and depositing a metal nitride layer thereon while preferably maintaining a temperature below the oxidizing temperature of the metal. The nitridized surface portion may further enhance resistance to oxidization of the underlying metal, especially for tungsten, for example.

DETAILED DESCRIPTION OF THE PREFERRED EMBODIMENTS

The present invention will now be described more fully hereinafter with reference to the accompanying drawings, in which preferred embodiments of the invention are shown.

This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for greater clarity.

Figure 1:
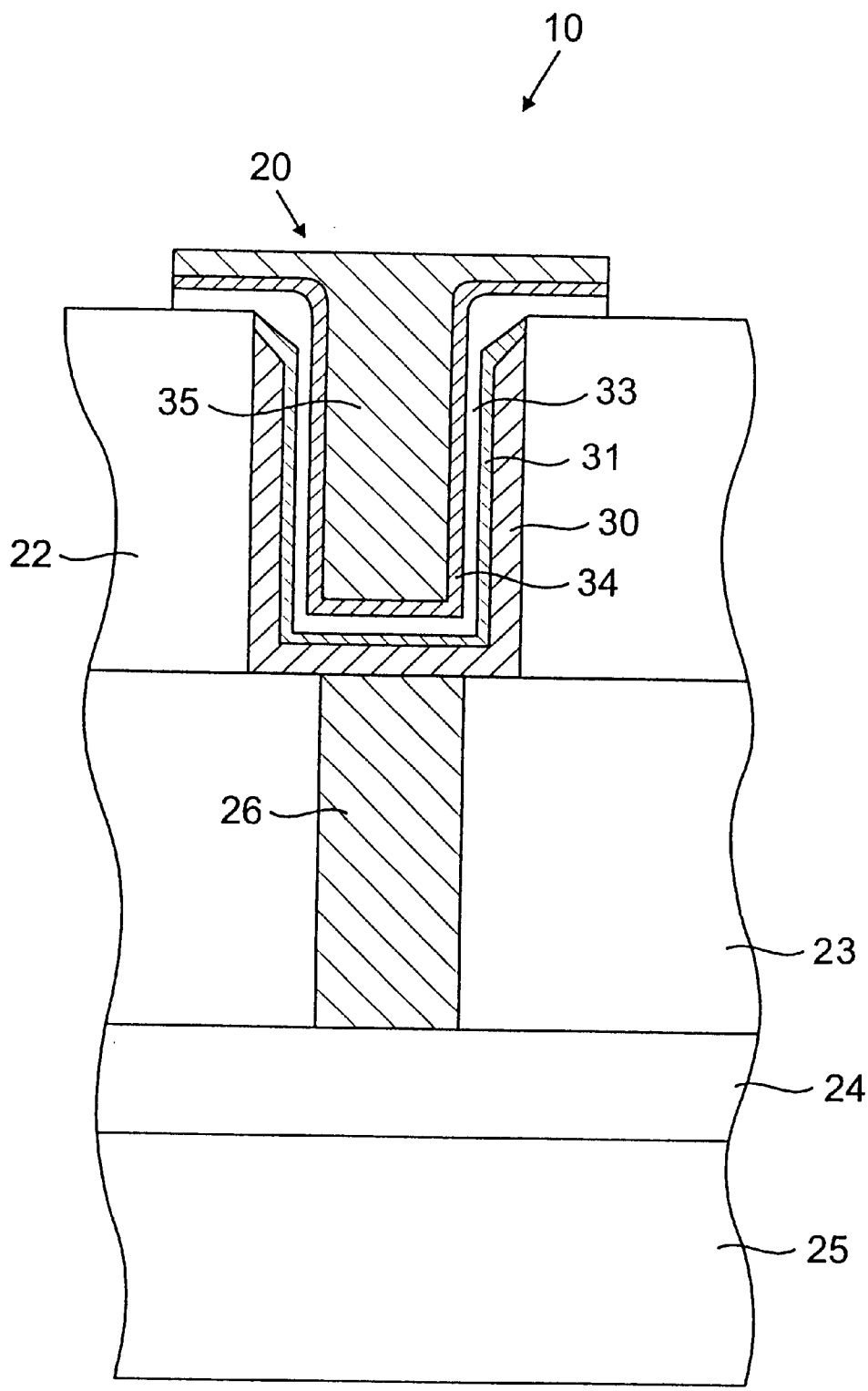
FIG. 1 is a schematic cross-sectional view of the capacitor made in accordance with the method of the invention.
Figure 2:
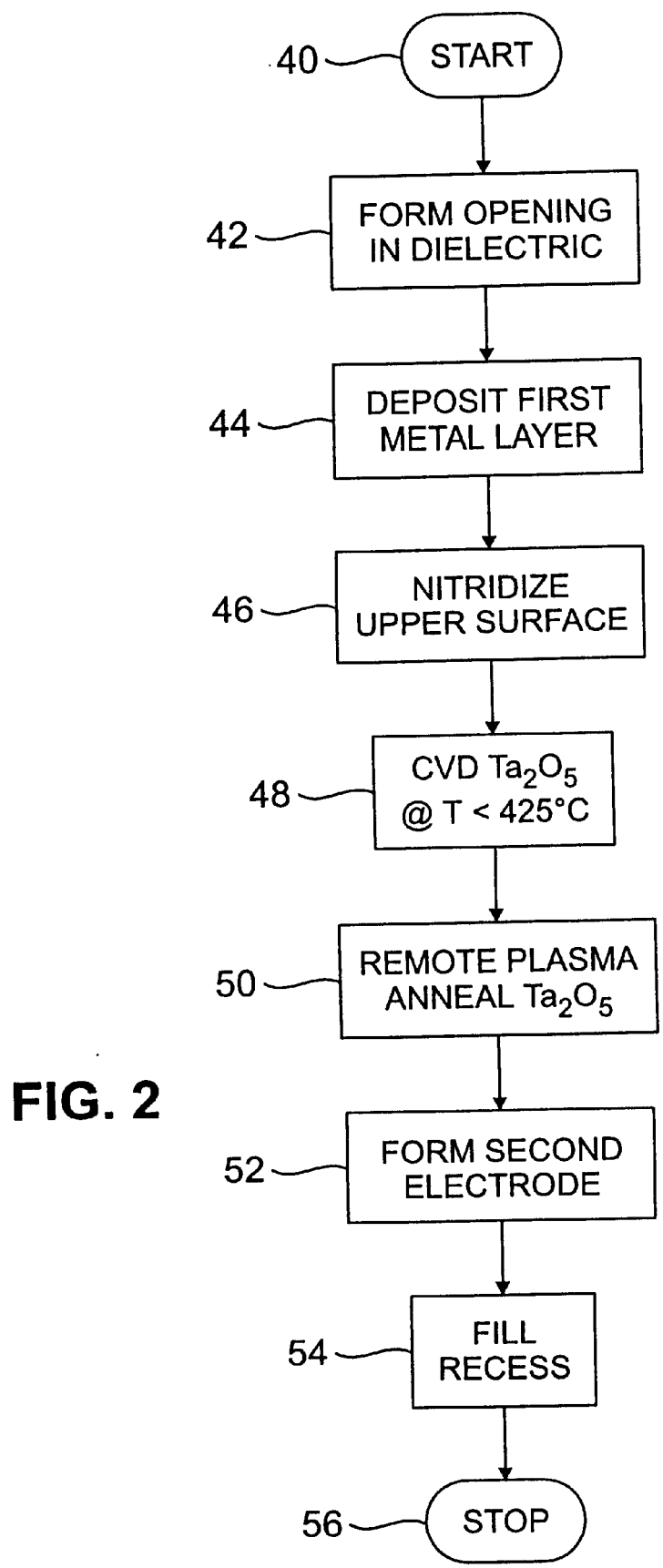
FIG. 2 is a flowchart for the method for making an integrated circuit capacitor in accordance with the present invention.

Referring to FIGS. 1 and 2, the method for making an integrated circuit 10 including a capacitor 20 is now described. The illustrated embodiment of the method includes, after the start (Block 40), forming an opening in a dielectric layer 22 (Block 40). The integrated circuit 10 also includes other dielectric layers 23, 24 formed on the semiconductor substrate 25, as well as the illustrated via 26 for connecting to the capacitor 20 as will be readily appreciated by those skilled in the art. The present invention is primarily directed to forming a capacitor 20 to be used in embedded DRAM applications where high-speed logic circuits, including their metallizations, have already been formed on the substrate as will be readily appreciated by those skilled in the art.

At Block 44, a first metal layer 30 is formed to line the opening in the dielectric layer 22. The first metal layer may preferably include titanium, tungsten, tantalum, and alloys thereof. The first metal layer 30 may be titanium nitride, tungsten, or tantalum nitride in some preferred embodiments. Titanium nitride and tantalum nitride are especially preferred materials. In other embodiments, the first metal layer 30 may include at least one of platinum, ruthenium, iridium, and alloys thereof. The first metal layer 30 is preferably formed by conventional CVD deposition techniques as will be readily appreciated by those skilled in the art without requiring further discussion herein.

If the first metal layer comprises tungsten, for example, it may be desirable to nitridize and upper surface portion thereof to produce the illustrated metal nitride layer 31 (Block 46). The tungsten nitride surface portion further resist oxidation of the underlying tungsten as will be appreciated by those skilled in the art. This nitridized surface portion can be formed by any of a number of conventional techniques, such as using a plasma and/or exposing the surface to a nitrogen containing ambient, such as ammonia, in a furnace. In another embodiment, the metal nitride layer 31 may be formed by conventional deposition techniques, such as CVD. The metal nitride layer 31 may be deposited while preferably maintaining a temperature below the oxidizing temperature of the metal. In other embodiments, such as, for example, where the first metal layer 30 comprises titanium nitride or tantalum nitride, the nitride layer 31 is not needed.

At Block 48, the tantalum pentoxide layer 33 is formed to serve as the capacitor dielectric layer. Of course, tantalum pentoxide is highly desirable as a dielectric for a capacitor in view of its relatively high dielectric constant value as compared to other conventional dielectric materials using in semiconductor manufacturing. The tantalum pentoxide layer 33 may be formed by a CVD process wherein $Ta(OC_2H_5)_5$ and oxygen are combined as will be readily appreciate by those skilled in the art.

In accordance with the present invention, the deposition temperature is maintained below an oxidizing temperature of the first metal electrode. More particularly, the temperature is desirably maintained below about 500° C., and, more preferably, below about 400° C. As will be readily appreciated by those skilled in the art, the time period for the CVD deposition of the tantalum pentoxide layer 33 is generally determined based upon the tools available. For better controllability of the process, the time is typically in the range of about 1 to 10 minutes, although faster times are possible such as achieved using Rapid Thermal Processing (RTP). In addition, to achieve sufficiently high deposition rates at the relatively low temperatures, the pressure may preferably be greater than about 3 Torr, such as in a range of about 3 to 15 Torr.

At Block 50, the tantalum pentoxide layer 33 is annealed, preferably using a remote plasma. The remote plasma produces a high quality tantalum pentoxide layer in terms of low leakage current. The remote plasma may include two separate anneals, wherein a first anneal is in pure nitrogen, and a second is an oxygen and nitrogen anneal, for example, as will be readily appreciated by those skilled in the art. The pressure may be about 1 to 5 Torr during the anneals. Of course, again the temperature is desirably below the oxidation temperature of the metal of the first electrode, such as below about 500° C., and more preferably below about 400° C.

Next, the second electrode 34 may be formed over the tantalum pentoxide layer 33 (Block 52) The second electrode 34 may preferably comprise metal, and, more preferably, may preferably comprise any of the metals identified above for the first metal electrode 30. A tungsten plug 35 may be formed to fill the recess defined in the opening by the capacitor layers at Block 45 before stopping (Block 56) as will be readily appreciated by those skilled in the art.

The method in accordance with the present invention provides a capacitor 20 having a higher capacitance than available in a conventional capacitor including a polysilicon lower electrode, for example. The capacitor 20 produced in accordance with the present invention may have a capacitance value of 20 femtoFarads/cm$^2$ as compared to a value of half that for a conventional capacitor. The tantalum pentoxide layer 33, because of the remote plasma anneal, has a relatively low leakage current as is also desirable for capacitors in integrated circuit devices as will be understood by those skilled in the art.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A method for making an integrated circuit capacitor comprising the steps of:

forming a first metal electrode adjacent a semiconductor substrate;

forming a tantalum pentoxide layer on the first metal electrode while maintaining a temperature below an oxidizing temperature thereof;

performing at least one remote plasma anneal of the tantalum pentoxide layer while maintaining a temperature below the oxidizing temperature of the first metal electrode; and forming a second electrode adjacent the tantalum pentoxide layer after the step of annealing and while maintaining a temperature below the oxidizing temperature of the first metal electrode.

2. A method according to claim 1 wherein the step of forming the tantalum pentoxide layer comprises chemical vapor deposition thereof at a temperature below about 500° C.

3. A method according to claim 1 wherein the step of forming the tantalum pentoxide layer comprises chemical vapor deposition thereof at a temperature below about 400° C.

4. A method according to claim 1 wherein the step of forming the tantalum pentoxide layer further comprises forming the tantalum pentoxide layer in a time of less than about 10 minutes.

5. A method according to claim 1 wherein the step of forming the tantalum pentoxide layer further comprises forming the tantalum pentoxide layer at a pressure of greater than about 3 Torr.

6. A method according to claim 1 wherein the step of performing at least one remote plasma anneal comprises exposing the tantalum pentoxide layer to a pure nitrogen containing remote plasma.

7. A method according to claim 6 wherein the step of performing at least one remote plasma anneal comprises exposing the tantalum pentoxide layer to an oxygen and nitrogen containing remote plasma after the pure nitrogen remote plasma anneal.

8. A method according to claim 1 wherein the step of forming the first metal electrode comprises forming the first metal electrode to include at least one of titanium, tungsten, tantalum, and alloys thereof.

9. A method according to claim 1 wherein the step of forming the first metal electrode comprises forming the first metal electrode to include at least one of titanium, tungsten, tantalum, platinum, ruthenium, iridium, and alloys thereof.

10. A method according to claim 1 wherein the step of forming the second electrode comprises forming a second metal electrode.

11. A method according to claim 1 further comprising the steps of:
   forming at least one dielectric layer adjacent the semiconductor substrate; and
   forming an opening in the at least one dielectric layer; and
   wherein the step of forming the first metal electrode comprises forming the first metal electrode to line the opening in the at least one dielectric layer.

12. A method according to claim 1 wherein the step of forming the first metal electrode comprises the steps of forming a first metal layer and nitridizing an upper surface portion thereof.

13. A method according to claim 12 wherein the step of nitridizing comprises exposing the first metal layer to a nitrogen containing ambient while maintaining a temperature below the oxidizing temperature of the metal.

14. A method according to claim 1 wherein the step of forming the first metal layer electrode comprises depositing a first metal layer and depositing a metal nitride layer thereon while maintaining a temperature below the oxidizing temperature of the metal.

15. A method for making an integrated circuit capacitor comprising the steps of:
   forming a first metal electrode adjacent a semiconductor substrate;
   forming a tantalum pentoxide layer on the first electrode while maintaining a temperature below about 500° C. for a time period of less than about 10 minutes;
   performing at least one remote plasma anneal of the tantalum pentoxide layer while maintaining a temperature below about 500° C.; and
   forming a second electrode adjacent the tantalum pentoxide layer after the step of annealing and while maintaining a temperature below about 500° C.

16. A method according to claim 15 wherein the step of forming the tantalum pentoxide layer comprises chemical vapor deposition thereof at a temperature below about 400° C.

17. A method according to claim 15 wherein the step of performing at least one remote plasma anneal comprises exposing the tantalum pentoxide layer to a pure nitrogen containing remote plasma.

18. A method according to claim 17 wherein the step of performing at least one remote plasma anneal comprises exposing the tantalum pentoxide layer to an oxygen and nitrogen containing remote plasma after the pure nitrogen remote plasma anneal.

19. A method according to claim 15 wherein the step of forming the first metal electrode comprises forming the first metal electrode to include at least one of titanium, tungsten, tantalum, and alloys thereof.

20. A method according to claim 15 wherein the step of forming the first metal electrode comprises forming the first metal electrode to include at least one of titanium, tungsten, tantalum, platinum, ruthenium, iridium, and alloys thereof.

21. A method according to claim 15 wherein the step of forming the second electrode comprises forming a second metal electrode.

22. A method according to claim 15 further comprising the steps of:
   forming at least one dielectric layer adjacent the semiconductor substrate; and
   forming an opening in the at least one dielectric layer; and
   wherein the step of forming the first metal electrode comprises forming the first metal electrode to line the opening in the at least one dielectric layer.

23. A method for making an integrated circuit capacitor comprising the steps of:
   forming, adjacent a semiconductor substrate, a first metal electrode comprising at least one of titanium, tungsten, tantalum, and alloys thereof;
   forming a tantalum pentoxide layer on the first metal electrode while maintaining a temperature below about 500° C.;
   remote plasma annealing the tantalum pentoxide layer in a pure nitrogen plasma;
   remote plasma annealing the tantalum pentoxide layer in a nitrogen and oxygen plasma after the pure nitrogen anneal; and
   forming a second electrode adjacent the tantalum pentoxide layer after the remote plasma annealing in the nitrogen and oxygen plasma.

24. A method according to claim 23 wherein the step of forming the tantalum pentoxide layer comprises chemical vapor deposition thereof at a temperature below about 400° C.

25. A method according to claim 23 wherein the step of forming the tantalum pentoxide layer further comprises forming the tantalum pentoxide layer in a time of less than about 10 minutes.

26. A method according to claim 23 wherein the step of forming the second electrode comprises forming a second metal electrode.

27. A method according to claim 23 further comprising the steps of:
   forming at least one dielectric layer adjacent the semiconductor substrate; and
   forming an opening in the at least one dielectric layer;
   wherein the step of forming the first metal electrode comprises forming the first metal electrode to line the opening in the at least one dielectric layer.

* * * * *